United States Patent
Yeh et al.

(10) Patent No.: US 6,943,098 B2
(45) Date of Patent: Sep. 13, 2005

(54) METHOD OF FORMING SEMICONDUCTOR DEVICE WITH NON-CONFORMAL LINER LAYER THAT IS THINNER ON SIDEWALL SURFACES

(75) Inventors: Fang-Yu Yeh, Taoyuan (TW); Chun-Che Chen, Kaohsiung (TW)

(73) Assignee: ProMOS Technologies Inc., Hsinchu (TW)

(*) Notice: Subject to any disclaimer, the term of this patent is extended or adjusted under 35 U.S.C. 154(b) by 0 days.

(21) Appl. No.: 10/605,326

(22) Filed: Sep. 23, 2003

(65) Prior Publication Data

US 2004/0259336 A1 Dec. 23, 2004

(30) Foreign Application Priority Data

Jun. 17, 2003 (TW) ........................................ 92116356 A

(51) Int. Cl.⁷ ............................................. H01L 21/477
(52) U.S. Cl. ...................... 438/525; 438/528; 438/592; 438/595; 438/766; 438/770
(58) Field of Search ............................... 438/525, 528, 438/586, 592, 595, 637, 675, 766, 770

(56) References Cited

U.S. PATENT DOCUMENTS 5,817,562 A * 10/1998 Chang et al. ............... 438/305
6,255,206 B1 * 7/2001 Jang et al. .................. 438/595
6,268,272 B1 * 7/2001 Jang ........................... 438/592
6,620,714 B2 * 9/2003 Su et al. ..................... 438/585
6,664,148 B2 * 12/2003 Goto et al. ................. 438/151
2002/0079492 A1 * 6/2002 Koga ........................... 257/66

FOREIGN PATENT DOCUMENTS

| TW | 445580 A | 7/2001 |
| TW | 499729 B | 8/2002 |

* cited by examiner

*Primary Examiner*—Stephen W. Smoot
(74) *Attorney, Agent, or Firm*—Jianq Chyun IP office

(57) ABSTRACT

A method of forming a contact opening is provided. First, a substrate having a plurality of conductive structures formed thereon is provided. An ion implantation is performed. Thereafter, a thermal treatment is carried out to form a liner layer on the sidewall of the conductive structure and the exposed substrate. The liner layer on the sidewall of the conductive structure has a thickness smaller than the liner layer on the substrate surface. A spacer is formed on each side of the conductive structure and then an insulation layer is formed over the substrate. The insulation layer is patterned to form a contact opening between two neighboring conductive structures. Since the liner layer on the sidewall of the conductive structures is already quite thin, there is no need to reduce thickness through an etching operation and uniformity of the liner layer on the substrate can be ensured.

13 Claims, 5 Drawing Sheets

METHOD OF FORMING SEMICONDUCTOR DEVICE WITH NON-CONFORMAL LINER LAYER THAT IS THINNER ON SIDEWALL SURFACES

CROSS REFERENCE TO RELATED APPLICATIONS

This application claims the priority benefit of Taiwan application serial no. 92116356, filed Jun. 17, 2003.

BACKGROUND OF INVENTION

1. Field of the Invention

The present invention generally relates to a process of manufacturing semiconductor devices. More particularly, the present invention relates to a method of forming contact openings and a method of forming semiconductor devices.

2. Description of the Related Art

With rapid advancement in semiconductor fabrication technologies, the size of semiconductor devices has shrunk to deep sub-micron levels. As the level of integration of integrated circuits increases, the surface of a chip alone can hardly have sufficient area for accommodating all the interconnects. To provide necessary interconnects after device miniaturization, a design having two or more metallic interconnects is routinely used in very large scale integration (VLSI) packages. However, to connect two metallic lines at different layers, the intermediate insulating layer is bored to produce an opening and then a conductive material is deposited into the opening to form a conductive plug structure.

To combat the shrinking line width and prevent any misalignment of contact opening, most semiconductor devices employs a self-align contact design. This is particularly true in the design of a memory device. Typically, the doped region in a substrate and a bitline above the substrate are electrically connected through a self-aligned contact.

FIGS. 1A through 1F are schematic cross-sectional views showing the progression of steps for producing a conventional contact opening in a memory device. As shown in FIG. 1A, a substrate 100 having a gate structure 112 with a cap layer 110 thereon is provided. Each gate structure 112 comprises a gate dielectric layer 104, a polysilicon layer 106 and a metal silicide layer 108. The labeled region 102 is a prescribed region for forming a bitline contact while the labeled region 103 is a prescribed region where no bitline contact is formed.

As shown in FIG. 1B, a tungsten silicide etching process is performed to remove a portion of the sidewall of the tungsten silicide layer 108. Thus, the tungsten silicide layer 108a form a recess on the sidewall to neighboring film layers.

As shown in FIG. 1C, a thermal oxidation operation is performed to form an oxide liner 114 on the sidewalls of the gate structure 112 and the exposed substrate 100 surface. Because a portion of the metal silicide layer 108 on the sidewall has been removed, lateral extrusion caused by crystal growth on the metal silicide layer 108a can be avoided.

As shown in FIG. 1D, a photoresist layer 116 is formed over the substrate 100 covering the region 103. Thereafter, a sidewall oxidation layer etching operation is performed to reduce the thickness of the exposed oxide liner 114 and produce an oxide liner 114a. The purpose of reducing the thickness of the oxide liner 114 within the region 102 is to increase the width of the gap (opening) and reduce the aspect ratio so that the process window in subsequent etching or depositing operation can be increased.

As shown in FIG. 1E, the photoresist layer 116 is removed. A spacer 118 is formed on the sidewall of the gate structure 112 and the cap layer 110, for example, by forming a silicon nitride layer (not shown) over the substrate 100 and then perform an anisotropic etching operation. However, during the anisotropic etching operation, a portion of the exposed oxide liner 114a or the entire exposed oxide liner 114a may be removed due to a reduced thickness within the region 102. In other words, a portion of the substrate 100 will be exposed.

As shown in FIG. 1F, an insulation layer 120 is formed over the substrate 100. Thereafter, photolithographic and etching processes are carried out to pattern the insulation layer 120 and form a self-aligned contact (SAC) opening 122 within the region 102 between two neighboring gate structures 112.

Even though a portion of the substrate 100 within the region 102 has been exposed however, it is to be noted that portions of the substrate 100 may not be exposed in each and every contact openings in the other regions (not shown). The etching process of self-align contact opening directly etch through to substrate to ensure that portions of the substrate 100 are exposed within other contact openings. However, this practice may cause over-etching of the substrate 100 leading to some structural damage as shown by the numeral 117 in FIG. 1F.

In general, the region in the substrate 100 marked as 117 is a doped region (not shown). Hence, damaging the region 117 may lead to junction leakage problems. To compensate for the damage in the substrate 100, an additional ion implantation has to be carried out so that the correct dopant concentration is restored. Therefore, the processing step is not only more complicated but may also intensify short channel effect.

SUMMARY OF INVENTION

Accordingly, one object of the present invention is to provide a method of forming a contact opening capable of reducing junction leakage resulting from a damaged substrate surface in a conventional bitline contact opening fabrication process.

A second object of this invention is to provide a method of forming a contact opening capable of reducing the complexity in fabricating a conventional bitline contact opening.

To achieve these and other advantages and in accordance with the purpose of the invention, as embodied and broadly described herein, the invention provides a method of forming a contact opening. First, a substrate having a plurality of conductive structures such as gate structures thereon is provided. An ion implantation is performed for implanting nitrogen ions at a slant angle into the sidewalls of the conductive structures. Alternatively, an ion implantation is performed for implanting oxygen or argon ions vertically into the substrate between the conductive structures. A metal silicide etching process can also be optionally carried out before or after the ion implantation so that a portion of the metal silicide attached to the sidewall of the gate structures is removed. Thereafter, a thermal treatment is carried out to form a liner layer on the sidewall of the conductive structure and the exposed substrate. The liner layer on the sidewall of the conductive structure has a thickness smaller than the liner layer on the substrate surface. A spacer is formed on each side of the conductive structure and then an insulation layer is formed over the substrate. The insulation layer is patterned to form a contact opening between two neighboring conductive structures.

This invention also provides a method of fabricating a semiconductor device. First, a substrate with a plurality of gate structures each having a cap layer thereon is provided. An ion implantation is performed implanting nitrogen ions at a slant angle into the sidewall of the gate structure and the cap layer. Alternatively, oxygen or argon ions are implanted vertically into the substrate between two neighboring conductive structures. A metal silicide etching process can also be carried out by option before or after the ion implantation so that a portion of the metal silicide attached to the sidewall of the gate structures is removed. Thereafter, a thermal treatment is carried out to form a liner layer on the sidewall of the conductive structure and the exposed substrate. The liner layer on the sidewall of the gate structure and the cap layer have a thickness smaller than the liner layer on the substrate surface.

This invention utilizes a tilted or a vertical ion implantation to reduce the thickness of the liner layer that is subsequently formed on the sidewall of a gate structure when compared with the liner layer on the substrate surface. Ultimately, a wider gap is produced between the neighboring gate structures and hence the process window for a subsequent etching or deposition is increased.

Furthermore, there is no need to etch the liner layer in this invention. Hence, uniformity of the liner layer on the substrate can be ensured and damages to the substrate surface due to over-etching can be avoided.

In addition, the method for fabricating a contact opening according to this invention is capable of preventing any damage to the substrate surface (the doped region), junction leakage is greatly minimized. Moreover, with damage to the substrate surface reduced, ion implantation for restoring dopant concentration is no longer necessary. In other words, the contact opening fabrication process is very much simplified.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
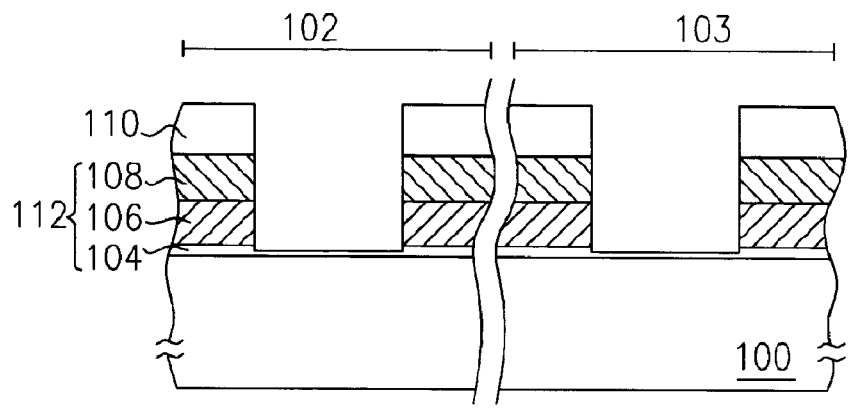
FIGS. 1A through 1F are schematic cross-sectional views showing the progression of steps for producing a conventional contact opening in a memory device.
Figure 1B:
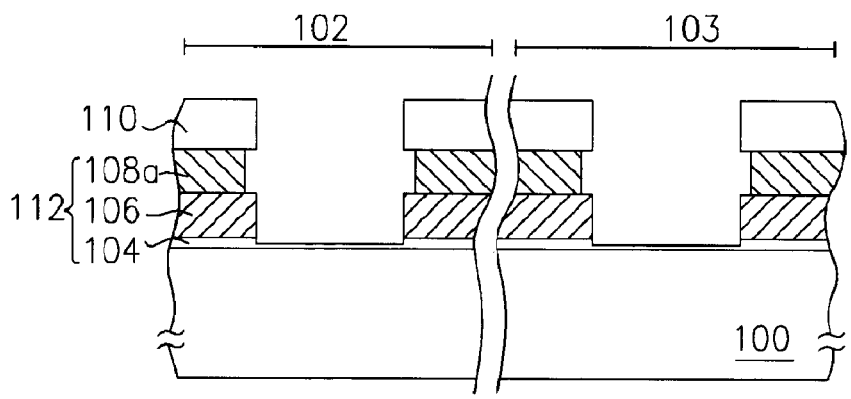
Figure 1C:
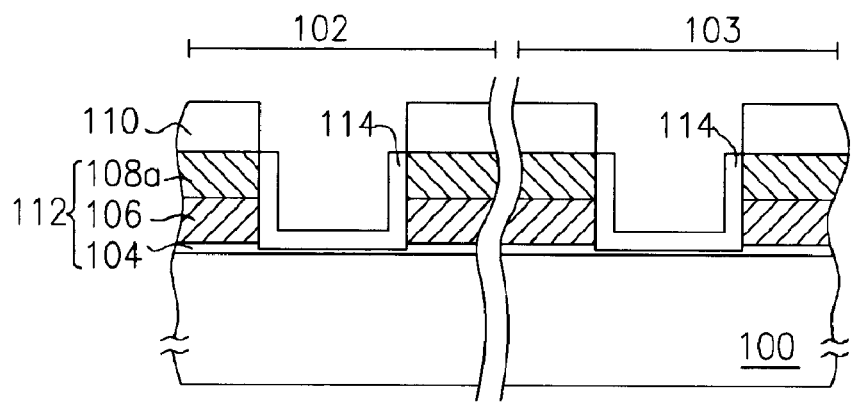
Figure 1D:
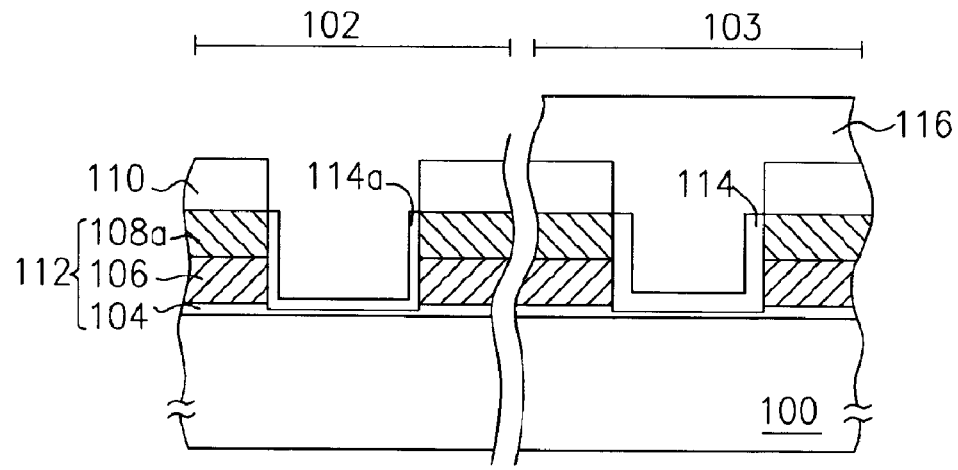
Figure 1E:
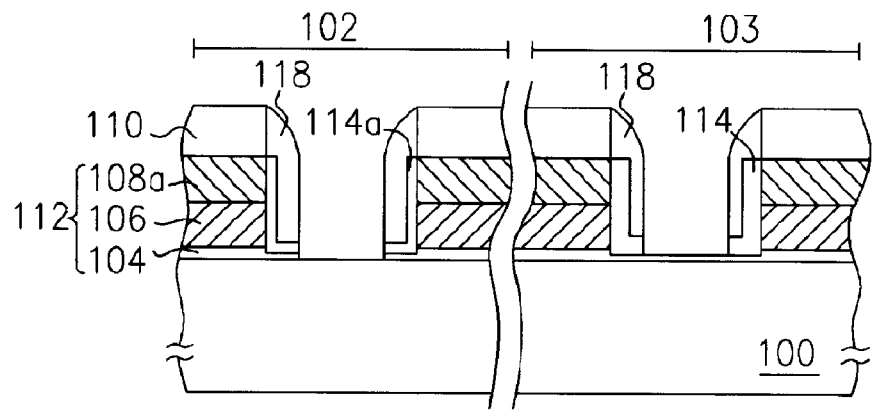
Figure 1F:
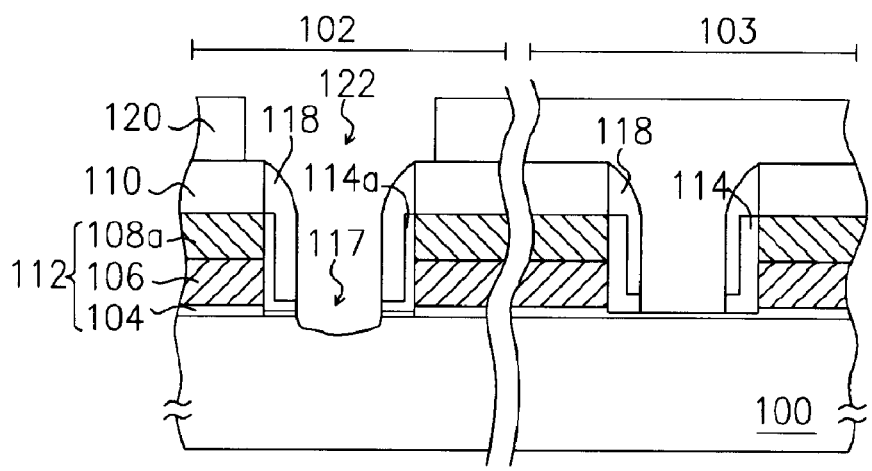

Reference will now be made in detail to the present preferred embodiments of the invention, examples of which are illustrated in the accompanying drawings. Wherever possible, the same reference numbers are used in the drawings and the description to refer to the same or like parts.

Figure 2A:
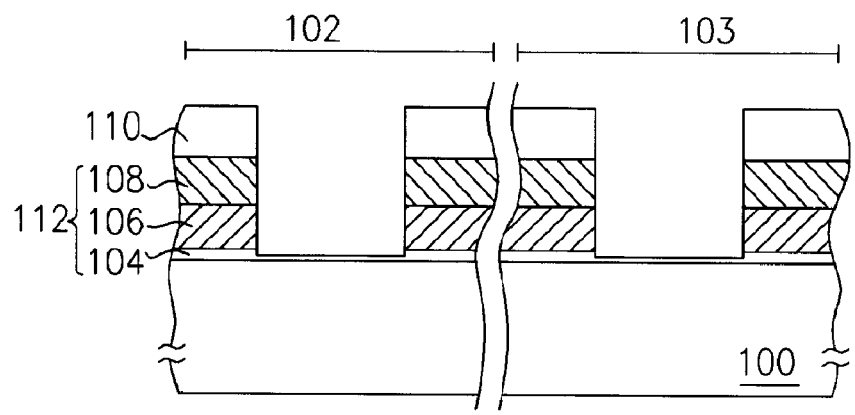
FIGS. 2A through 2G are schematic cross-sectional views showing the progression of steps for producing a contact opening according to one preferred embodiment of this invention.

FIGS. 2A through 2G are schematic cross-sectional views showing the progression of steps for producing a contact opening according to one preferred embodiment of this invention. As shown in FIG. 2A, a substrate 100 with a plurality of conductive structures 112 each having a cap layer 110 thereon is provided. In FIG. 2A, the region labeled 102 is the location for forming a bitline contact and the region labeled 103 is the location having no bitline contact. In other words, the region 102 is a prescribed area within a memory cell region for forming a bitline contact. On the other hand, the region 103 is a prescribed area within a peripheral circuit region or an area within the memory cell region where a bitline contact is not formed.

In one embodiment of this invention, the conductive structure 112 is a gate structure comprising a gate dielectric layer 104, a polysilicon layer 106 and a metal silicide layer 108, for example. To form the conductive structure 112, a dielectric layer (not shown), polysilicon layer (not shown), a metal silicide layer (not shown) and a silicon nitride layer (not shown) are sequentially deposited over the substrate 100. Thereafter, photolithographic and etching processes are carried out to pattern the silicon nitride layer and form a cap layer 110. Using the cap layer 110 as an etching mask, the metal silicide layer and the polysilicon layer are patterned to form the gate structure 112. In the process of patterning the gate structure 112 through an etching operation, a portion of the gate of the gate dielectric layer 104 is reduced.

Figure 2B:
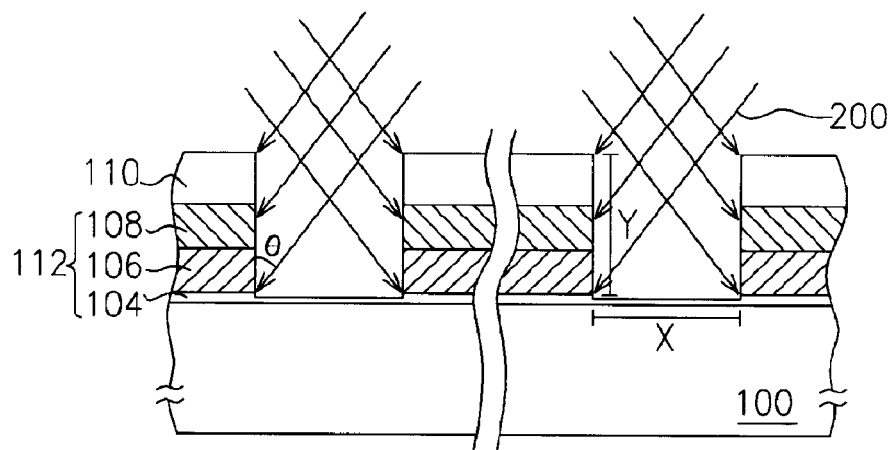

As shown in FIG. 2B, a tilted ion implantation 200 is carried out implanting ions into the sidewalls of the gate structure 112 and sidewalls of the cap layer 110. In the tilted ion implantation 200, the beam of implant ions is set at an angle so that the ions will penetrate the sidewalls of the gate structure 112 and the sidewalls of the cap layer 110 such that no ions penetrate the surface of the substrate 100 and end up within the substrate 100. Hence, it is important that the angle of the implanting ion beam must be set correctly. In other words, if the gap between neighboring gate structure 112 is X and the height of the opening is Y, the smallest tilt angle θ for the tilted ion implantation beam must satisfy the equation tan θ=X/Y. That is, the tilt angle for carrying out the tilted ion implantation 200 must be greater than the angle θ.

In one embodiment of this invention, the ions of tilted ion implantation 200 have the capability to inhibit the growth of an oxide film layer during a thermal oxidation operation. One type of ion having such a capability is nitrogen. In general, the tilted ion implantation 200 is carried out at an energy level between 5 KeV to 15 KeV and an implant dosage between 5E13/cm$^2$ to 5E14/cm$^2$.

Figure 2C:
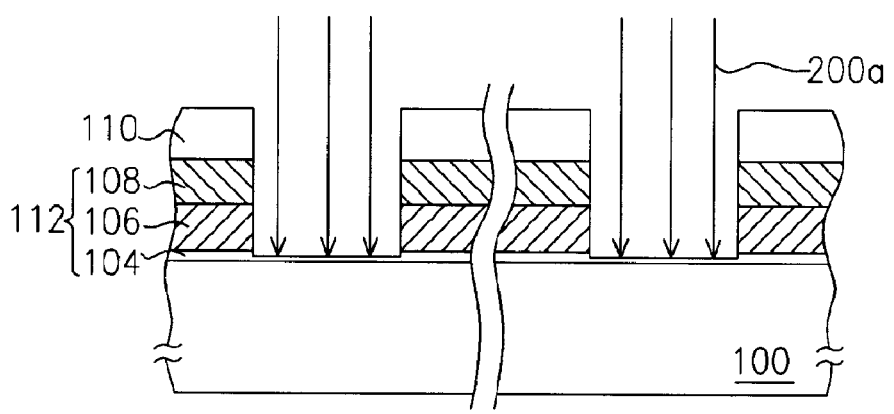

Aside from implanting ions into the sidewalls of the gate structures 112 and the cap layer 110 via a tilt angle, a vertical implantation can also be used to implant ions into the substrate to produce equivalent effect of inhibiting the growth of oxide film layer on the sidewall of the gate structures 112 and the cap layer 110. As shown in FIG. 2C, after steps of FIG. 2A a vertical ion implantation 200a is carried out, during which ions are implanted into the substrate 100 between two neighboring gate structures 112. In the vertical ion implantation 200a, the beam of implant ions aims vertically down so that the ions will penetrate into the substrate 100 between neighboring gate structures 112 only. None of the ions will pass through the sidewalls of the gate structures 112 or the cap layer 110.

In one embodiment of this invention, the ions used for carrying out the vertical ion implantation 200a have the capability to enhance the growth of an oxide film layer during a thermal oxidation operation. One type of ion having such a capability is oxygen or argon.

Figure 2D:
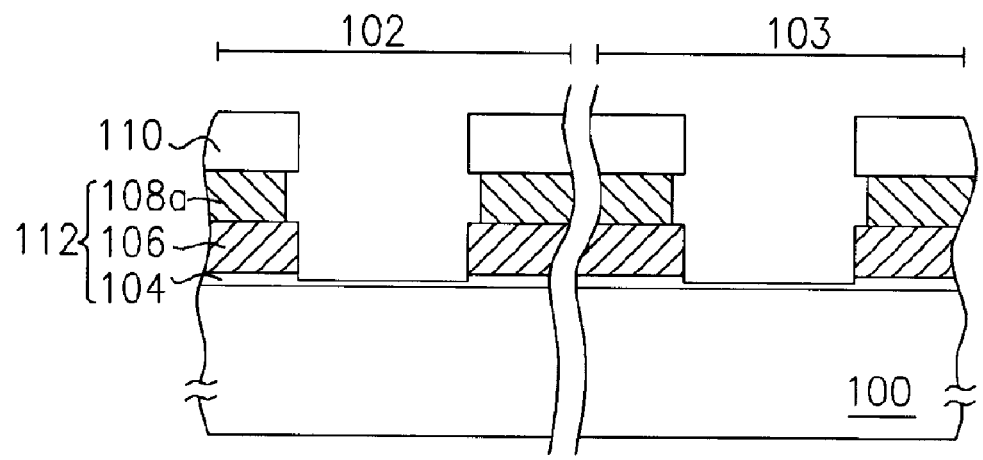

Before or after the tilted ion implantation 200 or the vertical ion implantation 200a, a metal silicide etching operation can be optionally carried out to remove a portion of the sidewalls of the metal silicide layer 108 within the gate structure 112 and form a structure as shown in FIG. 2D. The etching operation can be carried out using, for example, a RCA1 etching solution. Since the cap layer 110, the polysilicon layer 108 and the gate dielectric layer 104 are resistant to the etching solution, only a portion of the exposed metal silicide sidewall 108 will be removed to produce a recess metal silicide layer 108a.

The purpose of removing a portion of the metal silicide layer 108 through etching is to prevent crystal overgrowth on the metal silicide layer 108 in a subsequent thermal treatment process that may lead to the production of lateral extrusion. The presence of lateral extrusion on the sidewall of the gate structure 112 often causes undesirable short circuit.

However, with the implantation of nitrogen ions into the sidewalls of the gate structure 112 and the cap layer 110, the degree of lateral extrusion from the metal silicide layer 108 after a thermal treatment will be reduced. Alternatively, if ions capable of assisting the growth of a silicon oxide film layer are implanted into the substrate 100 between neighboring gate structures 112, overall process time of the thermal treatment can be shortened to reduce the thermal budget. With a lowering of the thermal budget, the extent of lateral extrusion from the metal silicon layer 108 after the thermal treatment is reduced. In other words, the etching operation in FIG. 2D is an optional procedure that may be carried out or not and also can be carried out before or after the tilted ion implantation 200.

Figure 2E:
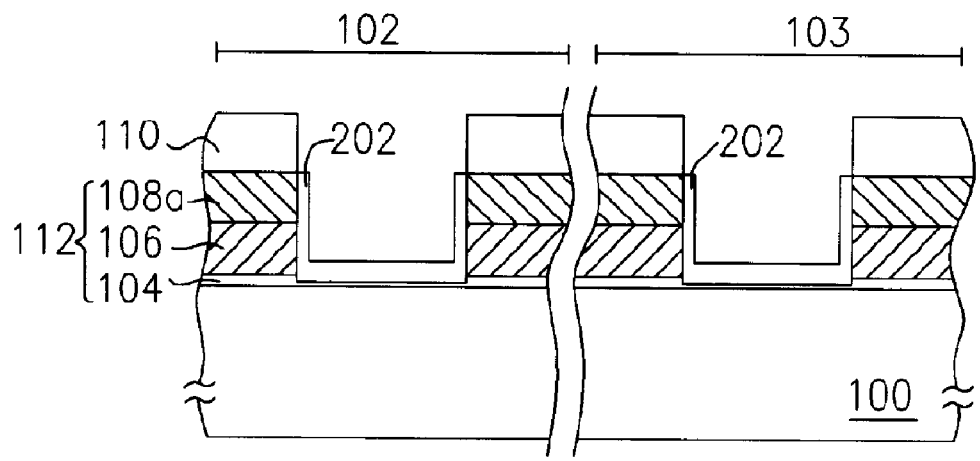

As shown in FIG. 2E, a thermal processing operation is carried out to from a liner layer 202 on the sidewalls of the gate structure 112 and the exposed substrate 100. The liner layer 202 on the sidewalls of the gate structure 112 has a thickness smaller than the liner layer 202 on the substrate 100. Because ions capable of inhibiting the growth of silicon oxide film have already been implanted into the sidewalls of the gate structure 112 or ions capable of enhancing the growth of silicon oxide film have already been implanted into the substrate 100 between two neighboring gate structures 112, the liner layer 202 on the sidewalls of the gate structure 112 will be thinner than the liner layer 202 on the substrate 100 after the thermal processing operation. The thermal processing operation for forming the silicon oxide liner 202 includes, for example, a rapid thermal processing operation followed by a rapid thermal oxidation.

Because the liner layer 202 on the sidewalls of the gate structure 112 is thin, there is no need to etch the sidewall oxide layer to increase the gap between neighboring gate structures. Hence, uniformity of the thickness of the liner layer 202 within the regions 102 and 103 are ensured.

Figure 2F:
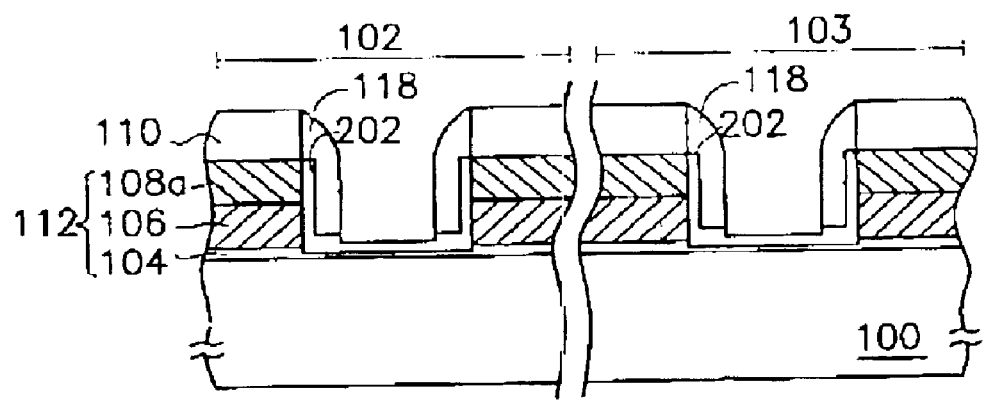

As shown in FIG. 2F, a spacer 118 is formed on each sidewall of the gate structure 112 and the cap layer 110. The spacers 118 are formed, for example, by depositing silicon nitride layer over the substrate 100 and then performing an anisotropic etching on the silicon nitride layer thereafter. Since the liner layer 202 on the substrate 100 is rather thick, the liner layer 202 will hardly be removed completely after the etching operation. In other words, the substrate 100 will not be exposed after the etching operation.

Figure 2G:
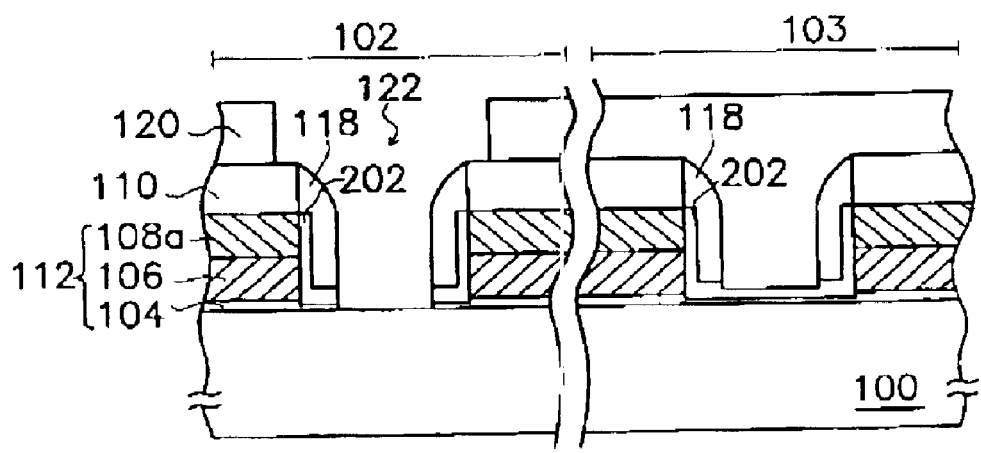

As shown in FIG. 2G, an insulation layer 120 is formed over the substrate 100. The insulation layer 120 is a silicon oxide layer, for example. Thereafter, the insulation layer 120 is patterned to form a self-aligned contact opening 122 that exposes a portion of the substrate 100 between two neighboring gate structures 112 within the region 102.

Aside from producing a thinner liner layer 202, the implanted nitrogen ions within the sidewalls of the gate structure 112 and the cap layer 110 also increases the selectivity between silicon nitride (the cap layer and the spacers) and silicon oxide (the insulation layer) in the etching operation for forming the self-align contact opening.

Thereafter, metallic material is deposited into the opening 122 to form a contact so that the doped region within the substrate 100 is electrically connected to a subsequently formed bitline.

This invention utilizes a tilt or a vertical ion implantation to reduce the thickness of the liner layer that is subsequently formed on the sidewall of a gate structure when compared with the liner layer on the substrate surface. Ultimately, a wider gap is produced between neighboring gate structures and hence the process window for a subsequent etching or deposition step is increased.

In this invention, the liner layer within the regions for forming contact openings as well as some other regions has a uniform thickness. Therefore, the probability of damaging the substrate due to etching through the thin section of a non-uniform liner layer is greatly minimized.

In addition, the method for fabricating a contact opening according to this invention is capable of preventing any damage to the substrate surface (the doped region), junction leakage is greatly minimized. Moreover, with damage to the substrate surface reduced, ion implantation for restoring dopant concentration is no longer necessary. The implantation of nitrogen ions into the sidewalls of the gate structure also provides another advantage. The implanted nitrogen ions within the sidewalls of the gate structure 112 and the cap layer 110 increase the etching selectivity between the silicon nitride layer and the silicon oxide layer in the process of forming the self-align contact opening.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a semiconductor device, comprising the steps of:

providing a substrate having a plurality of gate structures formed thereon, wherein each gate structure has a cap layer thereon;

performing an ion implantation for either implanting nitrogen ions into sidewalls of the gate structures or implanting oxygen or argon ions into exposed substrate between the gate structures; and performing a thermal processing operation to form a liner layer on sidewalls of the gate structures and exposed substrate, wherein ions implanted into the sidewalls of the gate structures suppress growth of the liner layer on the sidewalls of the gate structures and the ions implanted into the exposed substrate between the gate structures enhance growth of the liner layer on the exposed substrate so that the liner layer on the sidewalls of the gate structures has a thickness smaller than the liner layer on the exposed substrate.

2. The method of claim 1, wherein the step of performing an ion implantation furthermore comprises:

performing a tilt ion implantation for implanting ions into the sidewalls of the gate structures and the cap layers.

3. The method of claim 1, wherein the step of forming the gate structures comprises:
forming a gate dielectric layer, a polysilicon layer, a metal silicide layer and a silicon nitride layer over the substrate;
patterning the silicon nitride layer; and
patterning the metal silicide layer and the polysilicon layer.

4. The method of claim 3, wherein before the step of performing the ion implantation, further comprises a step of performing a metal silicide etching operation to remove a portion of the metal silicide layer on sidewalls thereof.

5. The method of claim 3, wherein after the step of performing the ion implantation, further comprises a step of performing a metal silicide etching operation to remove a portion of the metal silicide layer on sidewalls thereof.

6. The method of claim 1, wherein the thermal processing operation comprises a step of performing a rapid thermal annealing operation followed by a rapid thermal oxidation.

7. A method of manufacturing a semiconductor device, comprising the steps of:
providing a substrate;
forming a plurality of gate structures, wherein a portion of the substrate is exposed between the gate structures;
implanting ions into the exposed substrate between the gate structures; and
performing a thermal processing operation to form a liner layer on sidewalls of the gate structures and the exposed substrate, wherein the liner layer on the sidewalls of the gate structures has a thickness smaller than the liner layer on the exposed substrate.

8. The method of claim 7, wherein the step of implanting ions into the exposed substrate comprises:
performing a vertical ion implantation for implanting oxygen or argon ions into the exposed substrate between the gate structures, wherein the oxygen or argon ions have a capability to enhance growth of the liner layer during the thermal processing operation.

9. The method of claim 7, wherein the step of forming the gate structures comprises:
forming a gate dielectric layer, a polysilicon layer, a metal silicide layer and a silicon nitride layer over the substrate;
patterning the silicon nitride layer; and
patterning the metal silicide layer and the polysilicon layer.

10. The method of claim 9, wherein before the step of implanting ions into the exposed substrate, further comprises a step of performing a metal silicide etching operation to remove a portion of the metal silicide layer on sidewalls thereof.

11. A method of manufacturing a semiconductor device, comprising the steps of:
providing a substrate having a plurality of gate structures formed thereon, wherein each gate structure has a cap layer thereon;
performing an ion implantation for either implanting nitrogen ions into sidewalls of the gate structures or implanting oxygen or arson ions into exposed substrate between the gate structures; and
performing a thermal processing operation to form a liner layer on sidewalls of the gate structures and exposed substrate, wherein nitrogen ions implanted into the sidewalls of the gate structures suppress growth of the liner layer on the sidewalls of the gate structures and the oxygen or argon ions implanted into the exposed substrate between the gate structures enhance growth of the liner layer on the exposed substrate so that the liner layer on the sidewalls of the gate structures has a thickness smaller than the liner layer on the exposed substrate.

12. The method of claim 11, wherein a tilt ion implantation process is carried out for implanting nitrogen ions into the sidewalls of the gate structures and a vertical ion implantation process is carried out for implanting oxygen or argon ions into the exposed substrate between the gate structures.

13. The method of claim 11, wherein the step of forming the gate structures comprises:
forming a gate dielectric layer, a polysilicon layer, a metal silicide layer and a silicon nitride layer over the substrate;
patterning the silicon nitride layer; and
patterning the metal silicide layer and the polysilicon layer.

* * * * *